United States Patent [19]
Qureshi et al.

[11] Patent Number: 5,893,168
[45] Date of Patent: Apr. 6, 1999

[54] STRUCTURE AND METHOD FOR MEMORY INITIALIZATION AND POWER ON

[75] Inventors: Amjad Qureshi, San Jose; Kab Ju Moon, Cupertino, both of Calif.

[73] Assignee: Samsung Electronics Co., Ltd., Seoul, Rep. of Korea

[21] Appl. No.: 733,407

[22] Filed: Oct. 18, 1996

[51] Int. Cl.[6] .................................................. G06F 13/12
[52] U.S. Cl. .......................... 711/166; 711/156; 395/878; 395/848; 395/881
[58] Field of Search .................................. 395/878, 848, 395/881; 711/156, 166; 364/492

[56] References Cited

U.S. PATENT DOCUMENTS

| | | | |
|---|---|---|---|
| 5,212,795 | 5/1993 | Hendry | 395/848 |
| 5,632,038 | 5/1997 | Fuller | 395/750.06 |
| 5,650,939 | 7/1997 | Yoshida | 364/492 |

*Primary Examiner*—Tod R. Swann
*Assistant Examiner*—J. Peikari
*Attorney, Agent, or Firm*—Skjerven, Morrill, MacPherson, Franklin & Friel; David T. Millers

[57] ABSTRACT

An SDRAM initialization and power on system includes a configuration validation circuit for registers in a Memory Controller Unit and a Power On Sequence State Machine. The validation circuit asserts a status signal Config_OK if the configuration of the memory control unit is correct. The signal Config_OK enables the Power On Sequence State Machine. A status signal PowerOn_OK is asserted once the SDRAMs have been initialized. The SDRAMs are not accessible for normal operation unless Config_OK and PowerOn_OK are asserted. By monitoring the two signals Config_OK and PowerOn_OK, debugging can be much more efficient and corruption of SDRAMs with bad data can be avoided.

20 Claims, 5 Drawing Sheets ized. The entries in registers 118, 120, 122, 124, 126, 128, 130, and 132 are shown in Table 1.

STRUCTURE AND METHOD FOR MEMORY INITIALIZATION AND POWER ON

BACKGROUND OF THE INVENTION

Synchronous Dynamic Random Access Memory (SDRAM) has been developed to reduce or avoid time delays caused by access time and cycle time of slower conventional Dynamic Random Access Memory (DRAM). SDRAMs take in external signals in synchronization with an externally applied clock signal which allows precise cycle control and input/output transactions on every clock cycle. However, SDRAMs require initialization before any operational use can be made of the SDRAM. If SDRAMs are not correctly initialized, the SDRAMs will not function properly. Current systems which initialize SDRAM typically assume that proper initialization has occurred and proceed to operational use of the SDRAM without verification that a memory controller has been properly programmed.

SUMMARY OF THE INVENTION

In accordance with this invention, two logical components are used to power-up a memory: a configuration sequence to configure a plurality of registers in a Memory Controller Unit and a Power On Sequence State Machine. The registers in the memory control unit contain operating parameters for an SDRAM. If the operating parameters are improperly configured (i.e., the entered parameters are not a member of the set of allowed parameters) the SDRAM cannot be properly initialized for use. Two status signals, Config_OK and PowerOn_OK, are generated to indicate that the registers have an allowed value and a power on procedure has succeeded so that synchronous dynamic random memories (SDRAMs) are initialized and available for normal memory access. Without signals Config_OK and PowerOn_OK, the SDRAMs are not accessible for normal memory operation.

In accordance with one embodiment of this invention, a set of registers in the Memory Controller Unit have associated indicator signals, for example, status bits, that may be in a first logic state or a second logic state to indicate whether the registers store coded values needed for the proper initialization of SDRAMs after power on or reset.

A comparison circuit determines that an allowed coded value has been written to a register associated with a particular indicator, and sets an associated indicator signal accordingly. If all associated indicator signals indicate allowed configuration values, signal Config_OK is generated. Signal Config_OK indicates to an SDRAM Power On Sequence State Machine that allowed coded values have been written to each of the plurality of registers in the Memory Controller Unit. In the event that a signal Config_OK is not generated, the system needs to repeat the power on or reset operation.

In response to the signal Config_OK, the SDRAM Power On Sequence State Machine causes the SDRAMs to be initialized using the coded values and generates a PowerOn_OK signal to a Memory Controller Unit State Machine. After initialization of the SDRAMs, the Memory Controller is able to access the SDRAMs for normal operation. If the values in the plurality of registers are not allowed coded values, the Memory Controller is not enabled for accessing the SDRAMs. Monitoring the signal Config_OK and the signal PowerOn_OK allows efficient debugging and avoids corruption of the SDRAMs with bad data.

DETAILED DESCRIPTION OF INVENTION

In accordance with this invention, a structure and method that initializes all memory control registers in a memory controller unit and performs a power on sequence for SDRAMs prior to execution of any real memory accesses is disclosed. The structure and method assures proper initialization of critical memory control registers before real memory accesses are enabled.

Figure 1:
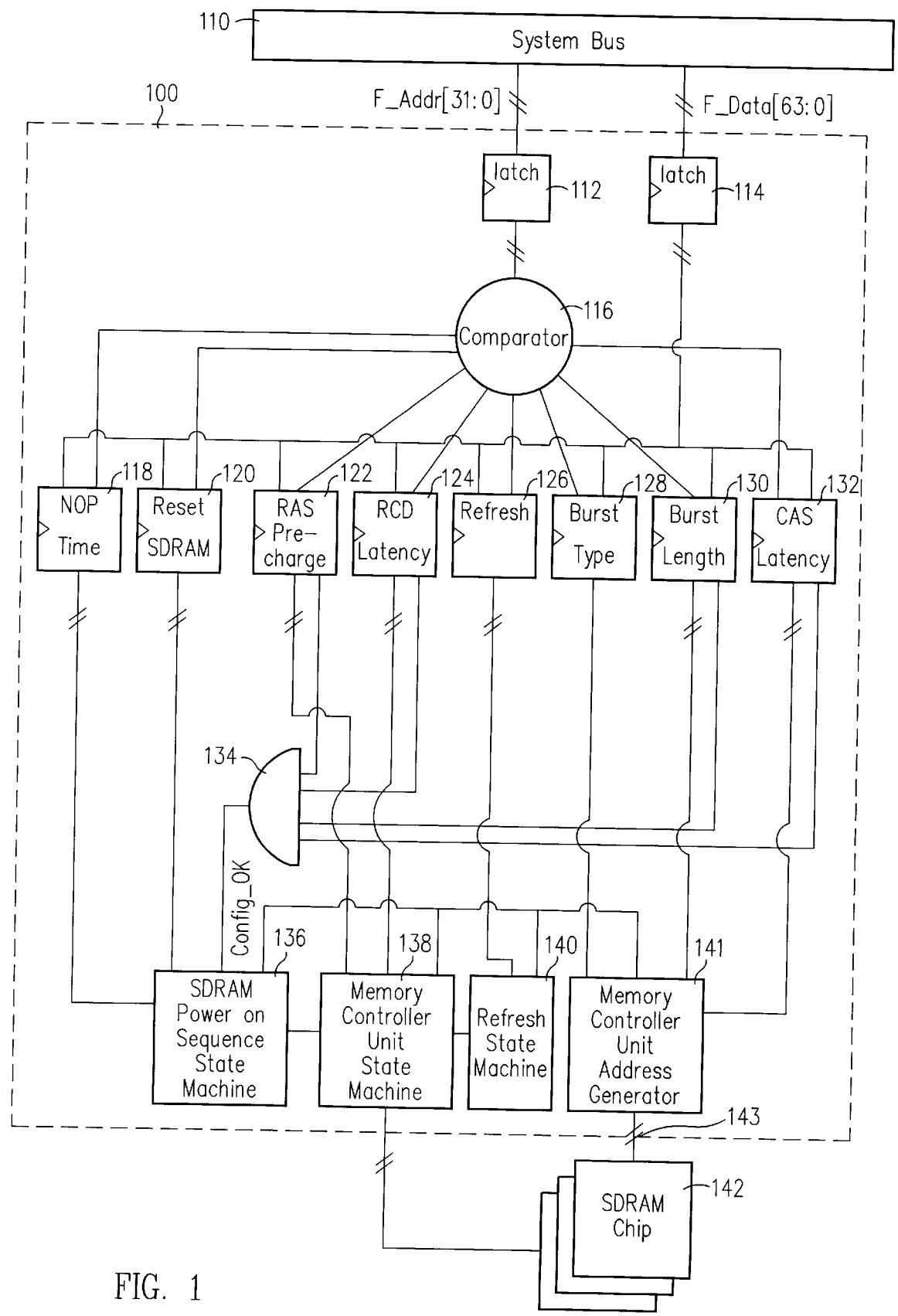
FIG. 1 shows a memory controller in accordance with an embodiment of this invention.

One embodiment in accordance with this invention is shown in FIG. 1. In this embodiment there are eight memory control registers in memory controller unit 100 which are configured via system bus 110 to program memory controller unit 100. System bus 110 carries address, control, and data information. 32-bit register address information from system bus 110 is latched on the rising edge of the clock in latch 112 for one clock cycle and then used by comparator 116. By comparing the address received over system bus 110 with the address of each of the registers, comparator 116 identifies the addressed one of registers 118, 120, 122, 124, 126, 128, 130, or 132 and enables the addressed register to receive data. The addresses of registers 118, 120, 122, 124, 126, 128, 130, and 132 are shown in Table 1.

TABLE 1

| | Register Addresses | |
| Register | Faddr [31:20] | Faddr [3:0] |
| --- | --- | --- |
| RESET | 12'h048 | 4'b1011 |
| BURST TYPE | 12'h048 | 4'b1010 |
| REFRESH | 12'h048 | 4'b1001 |
| RAS PRECHARGE | 12'h048 | 4'b1000 |
| CAS LATENCY | 12'h048 | 4'b0011 |
| RCD | 12'h048 | 4'b0010 |
| BURST LENGTH | 12'h048 | 4'b0001 |
| NOP TIME | 12'h048 | 4'b0000 |

In one embodiment in accordance with this invention, data associated with the address held in latch 112 are received from system bus 110 and are latched on the rising edge of the clock in latch 114 for one clock cycle before being stored in the enabled one of registers 118, 120, 122, 124, 126, 128, 130, or 132. Data consist of 64-bit words. In the embodiment of FIG. 1, the eight memory control registers are NOP TIME register 118, RESET register 120, RAS (row address strobe) PRECHARGE register 122, RCD (row address strobe column address strobe delay) LATENCY register 124, REFRESH register 126, BURST TYPE register 128, BURST LENGTH register 130, and CAS (column address strobe) LATENCY register 132.

The entries in registers 118, 120, 122, 124, 126, 128, 130, and 132 are used for initialization of SDRAMs 142 during the power on sequence. NOP TIME register 118 is a 16-bit register which sets the SDRAM NOP (no operation) time required for the power on sequence. In an exemplary embodiment, (see Samsung Data Book "16M Synchronous DRAM", March 1996 which is incorporated herein by reference), NOP TIME register 118 is programmed to the number of system clock cycles contained in a 200 µs period to allow timing. RESET register 120 is a 1-bit register that is reset to 1 after each system reset and register 120 must later be cleared in software to start the SDRAM power on sequence. RAS PRECHARGE register 122 is a 3-bit register that programs the SDRAM RAS precharge value and is set to either 1, 2, or 3 corresponding in one embodiment to a coded value of '001', '010', and '011', respectively. RCD register 124 is a 3-bit register that sets the SDRAM RCD latency to either 1, 2, or 3 corresponding to a coding of '001', '010', and '011', respectively. REFRESH register 126 is a 12 bit register that is programmed to the SDRAM refresh value. BURST TYPE register 128 is reset with a system reset and later set low for SEQUENTIAL SDRAM burst type or high for INTERLEAVE SDRAM burst type. BURST LENGTH register 130 is a 3 bit register that programs the SDRAM burst length for data and is set to either 1, 2, 4, or 8. Setting BURST LENGTH value to 1 is done at system reset and corresponds to a coding of '000' in one embodiment. During normal operation, BURST LENGTH register 130 is only toggled between values 2, 4, and 8. Setting BURST LENGTH values to 2, 4, or 8 corresponds to a coding of '001', '010', and '011', respectively, in one embodiment. CAS latency register 132 is a 3 bit register that programs the SDRAM CAS latency and is set to 1, 2 or 3 corresponding to a coding of '001', '010', and '011', respectively, in one embodiment. The size of the 3-bit registers is chosen to correspond to the length of the corresponding coded instruction used by the SDRAM (i.e., the SDRAM allows coded instruction '111' for full page BURST LENGTH but not used in the above embodiment).

In one embodiment, there are four associated indicators representing the status of entries in registers 122, 124, 130, and 132, respectively. These four registers contain coded values which must be one of the allowed coded values for proper SDRAM initialization to occur during the power on sequence. If registers 122, 124, 130, and 132 are not set to an allowed value, SDRAMs 142 are not accessible for normal operation and the system becomes inoperable. Each associated indicator signal may be in a first state or a second state. After power is turned on or the system is reset, the four associated indicators are initially in the first state. The four registers having an associated indicator for validation of register contents are those registers of length 3 bits i.e., the RAS PRECHARGE register, the CAS LATENCY register, RAS CAS DELAY register, and the BURST LENGTH register. If the value in a register matches an allowed value, the associated indicator relating to that register is changed from the first state to the second state.

Figure 2:
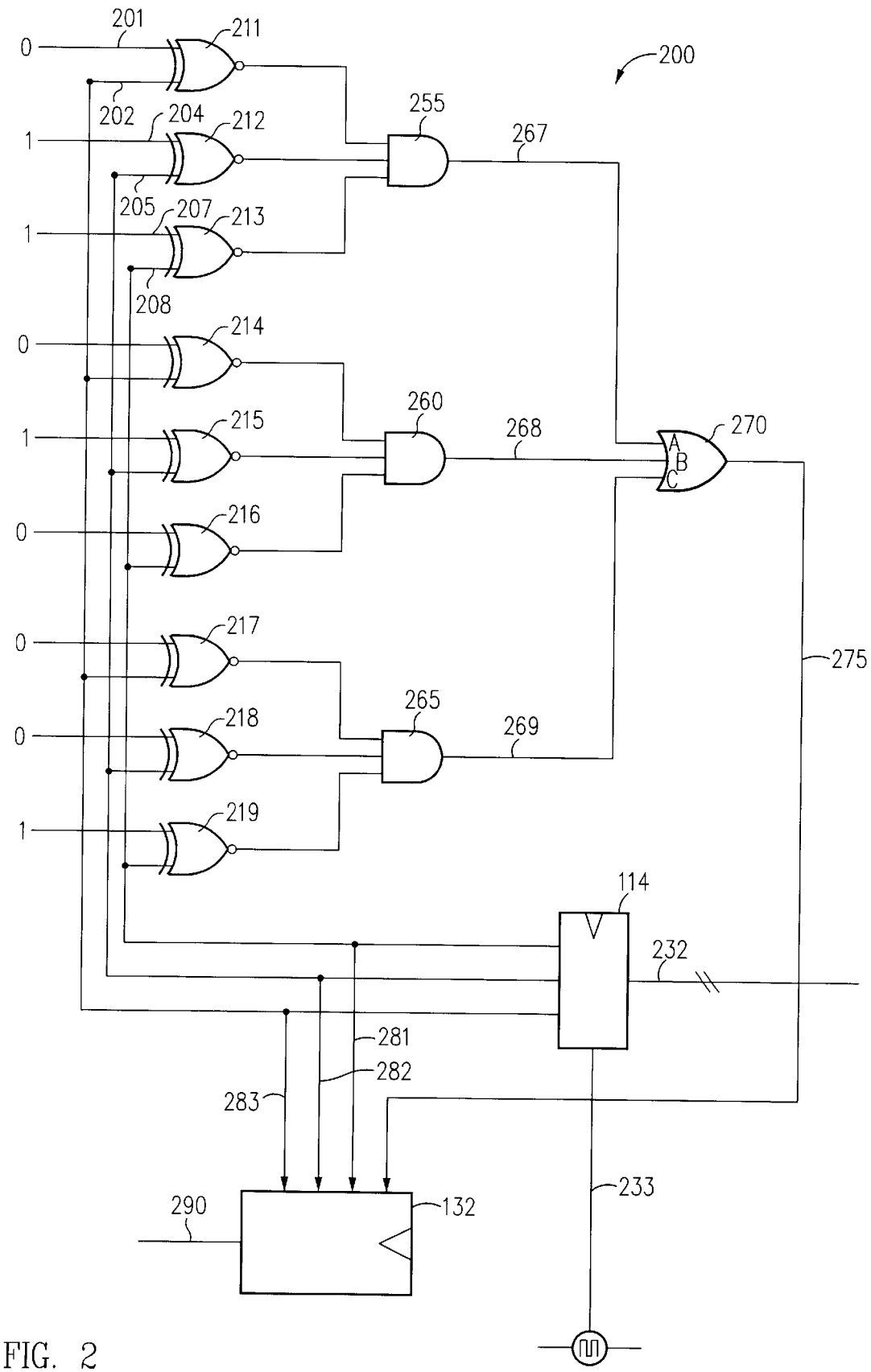
FIG. 2 shows an embodiment in accordance with this invention for determining whether a coded value stored in a memory controller register matches an allowed coded value.

FIG. 2 shows a comparison circuit 200 in accordance with an embodiment of this invention. Comparison circuit 200 is associated with register 132 and compares the value stored in register 132 with the values allowed for register 132. Each of registers 122, 124, and 130 has a similar comparison circuit. Comparison circuit 200 includes nine NOR gates 221 to 219 organized in three groups of three XNOR gates, three AND gates 255, 260, and 265, and one OR gate 270. Each group of three XNOR gates has three input reference signals, one to each XNOR in the group. The three reference signals correspond to a 3-bit value allowed for a valid register value. For example, XNOR gate 211 has the reference signal on input lead 201 set to logical 0 or low, XNOR gate 212 has the reference signal on input lead 204 set to logical 1 or high, and XNOR gate 213 has the reference signal on input lead 207 set to logical 1 or high to check for the coded value '011'. The reference signals may originate, for example, from a shadow register with there being a corresponding shadow register for each set of three XNOR gates. If the data signals on leads 202, 205, and 208 are respectively low, high, and high then the data signal from register 132 is valid and corresponds to coded value '011'.

Latch 114 is coupled to clock 240 by lead 233 and latches the data signal from system bus 110 (see FIG. 1) on a rising clock edge for one clock cycle before the data is stored. If the 3-bit data signal from latch 114 and register 132 is '011', output signals from XNOR gates 211 to 213 are all high (1) and an output signal from AND gate 255 is high (1). Otherwise, if the 3-bit data signal has any value other than '011', one or more of the output signals from XNOR gate 211 to 213 is low (0), and the output signal from AND gate 255 is low. Similarly, the output signal from AND gate 260 is high if the 3-bit data signal has value '010' and low otherwise; and the output signal from AND gate 265 is high if the data signal has value '001' and low otherwise.

AND gate output signals on leads 267, 268, and 269 are respectively coupled to input terminals A, B, and C of OR gate 270. If anyone of the AND gate output signals on leads 267, 268 or 269 is high, an output signal from OR gate 270 is high and latch 114 contains a valid entry for register 132. Register 132 is write enabled by comparator 116 on lead 290 to store the entry and a status bit in register 132. The associated status indicator signal is set to the second logic state to indicate register 132 has a valid entry. Comparisons to check for allowed entries in registers 122, 124, and 130 are made in the same fashion and result in the setting of three additional indicators for a total of four indicators.

Figure 4:
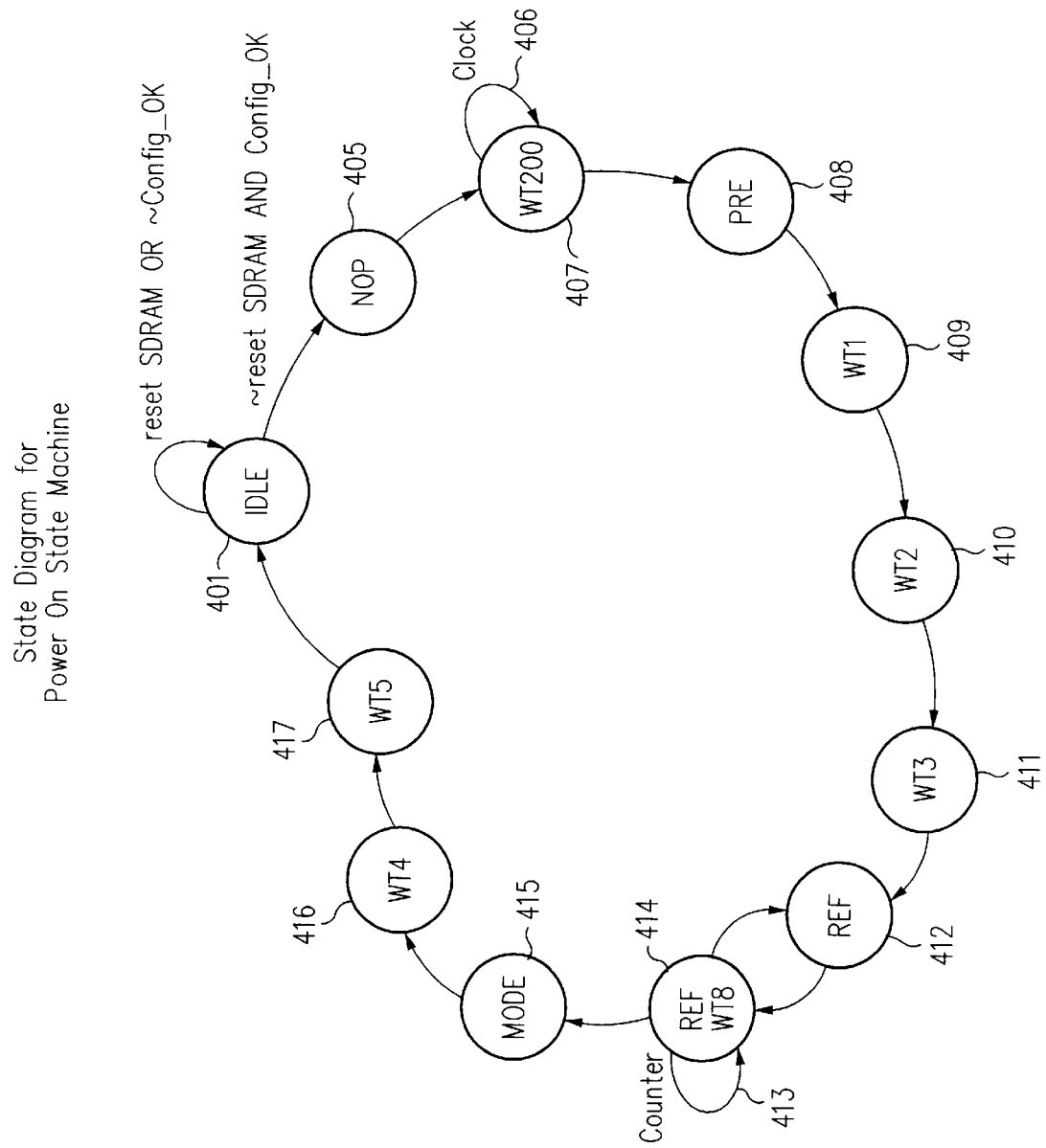
FIG. 4 shows a state diagram of a Power On State Machine in accordance with an embodiment of this invention.

In one embodiment in accordance with this invention, one of the bits in each of 4-bit registers 122, 124, 130, and 132, referred to as the status bit, stores the associated indicator signal. As shown in FIG. 1, the values of the four status bits associated with registers 122, 124, 130, and 132 are passed to the input terminals of AND gate 134. If all four status bits are in high (1), the output terminal of AND gate 134 goes to high (1) state, generating a signal Config_OK. If not all four status bits are high, the output terminal of AND gate 134 remains low, and a signal Config_OK is not asserted. Signal Config_OK being asserted enables SDRAM Power On State Machine 136 whose operation is represented in FIG. 4. SDRAM Power On State Machine 136 initializes SDRAMs 142.

Figure 3:
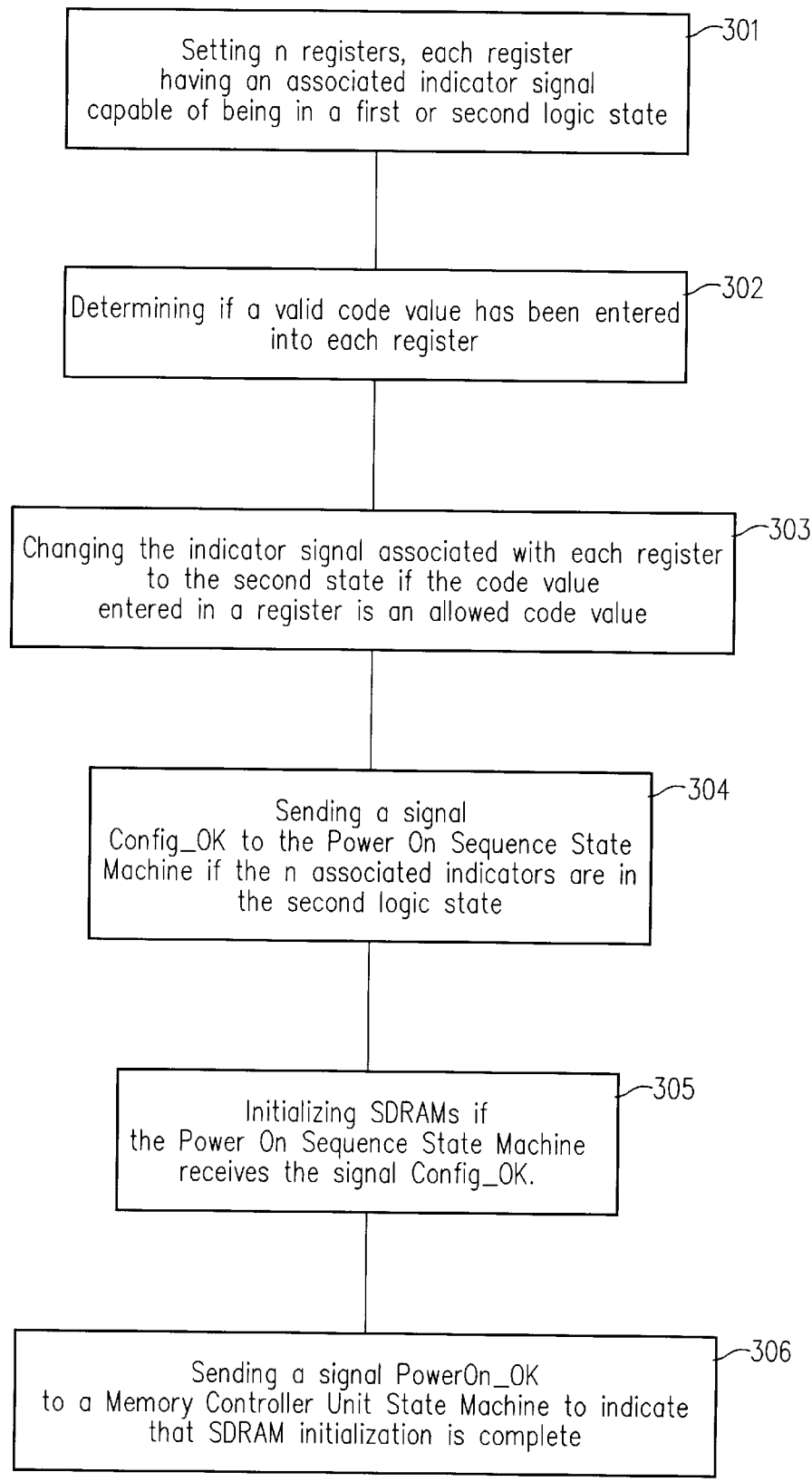
FIG. 3 shows a method for SDRAM initialization and power on in accordance with this invention.

FIG. 3 shows a method for SDRAM initialization and power on in accordance with this invention. Each block represents a step in the method. Block 301 is the step of setting n registers, each register having an associated indicator signal capable of being in a first or second logic state. Block 302 is the step of determining if a valid code value has been entered into each register. Block 303 is the step of changing the indicator signal associated with each register to the second logic state if the code value entered in a register is an allowed code value. Block 304 is the step of sending a signal Config_OK to the Power ON Sequence State Machine if the n associated indicator signals are in the second logic state. Block 305 is the step of initializing the SDRAMs if the Power On Sequence State Machine receives the signal Config_OK. Block 306 is the step of sending a PowerOn_OK signal to Memory Controller Unit State Machine 138 to indicate that SDRAM initialization is complete.

FIG. 4 shows a state diagram for an embodiment of SDRAM Power On State Machine 136. Initially, SDRAM Power on State Machine 136 is in IDLE 401 if signal Config_OK is not asserted or SDRAMs 142 are in reset state. If the SDRAMs are not in reset and signal Config_OK is asserted, SDRAM Power On State Machine 136 is active and applies NOP 405 (no operation) input condition to the pins of SDRAMs 142 for the number of clock cycles indicated by the value in register 118. In an exemplary embodiment where SDRAMs 142 are 16M SDRAMs available from Samsung (part nos. KM44S4020A, KM48S2020A, or KM416S1120A), NOP is accomplished by asserting pins RAS (row address strobe), CAS (column address strobe), and WE (write enable) high or, alternatively, by asserting CS (chip select) high. Following assertion of NOP 405 input condition in state PRE 408, SDRAM Power On Sequence State Machine 136 causes Memory Controller Unit State Machine 138 to precharge the banks of SDRAMS 142. Memory Controller Unit State Machine 136 precharges the banks of SDRAMs 142 by asserting low on SDRAM pins CS (chip select), RAS (row address strobe), WE (write enable) and address pin A10 with a valid input on Bank Select address pin A11. PRE 408 places the banks of SDRAMs 142 into a valid state. SDRAM Power On Sequence State Machine 136 then undergoes a 3 cycle wait: WT1 409, WT2 410, WT3 411 to allow completion of the precharge operation.

In state REF 412, SDRAM Power On Sequence State Machine 136 causes Refresh State Machine 140 to assert an autorefresh command. For autorefresh, Refresh State Machine 140 asserts low on SDRAM pins CS (chip select), RAS (row address strobe), and CAS (column address strobe) with high on CKE (clock enable) and WE (write enable). SDRAM Power On Sequence State Machine 136 causes eight autorefresh cycles to be performed to stabilize the internal circuitry of SDRAMs 142. The state changes from REF 412 to REF WT8 414 eight times. An internal counter 413 increments until eight autorefresh cycles have been completed. Given an 80 MHz clock, each autorefresh cycle takes 8 clock cycles resulting in 64 clock cycles being required for completion of the entire autorefresh operation during the power on sequence.

During MODE 415, SDRAM Power On Sequence State Machine 136 causes Memory Controller Unit Address Generator 141 to set SDRAM mode registers using address bus 143. Memory Controller Unit Address Generator 141 sets each SDRAM's mode register according to CAS latency, burst length and burst type values from registers 132, 130, and 128 respectively.

In one embodiment in accordance with this invention, SDRAM mode registers are accessed via address bus 143 during SDRAM initialization. The SDRAM mode register has 12 address bits, with 8 bits being used to store the values from registers 132, 130, and 128 in Memory Controller Unit 100. Specifically, the SDRAM mode register uses address A0–A2 for Burst Length, address A3 for Burst Type, address A4–A6 for CAS latency, address A7–A8 for Test Mode, and address A9 for Write Burst Length with address A10–A11 being reserved for future use. During startup, address A9 must be zero with A7–A8 and A10–A11 also being set to zero. Completion of the mode register write requires two clock cycles, WT4 416 and WT5 417, after which SDRAMs 142 are operational and SDRAM Power On Sequence State Machine 136 enters IDLE 401.

SDRAM Power On Sequence State Machine 136 generates a PowerOn_OK signal which indicates to Memory Controller State Machine 138, Refresh State Machine 140, and Memory Controller Unit Address Generator 141 that the SDRAM mode registers have been set. The two signals, PowerOn_OK and Config_OK must be generated to enable writing of data to SDRAMs 142 by Memory Controller Unit State Machine 138. Assertion of signals Config_OK and PowerOn_OK indicates that the SDRAM initialization information has been correctly written to registers 122, 124, 130, and 132 in Memory Controller Unit 100 and that SDRAM Power On Sequence State Machine 136 has completed the power on sequence for SDRAMs 142. Memory Controller State Machine 138 is now enabled to begin accessing SDRAMs 142.

Figure 5:
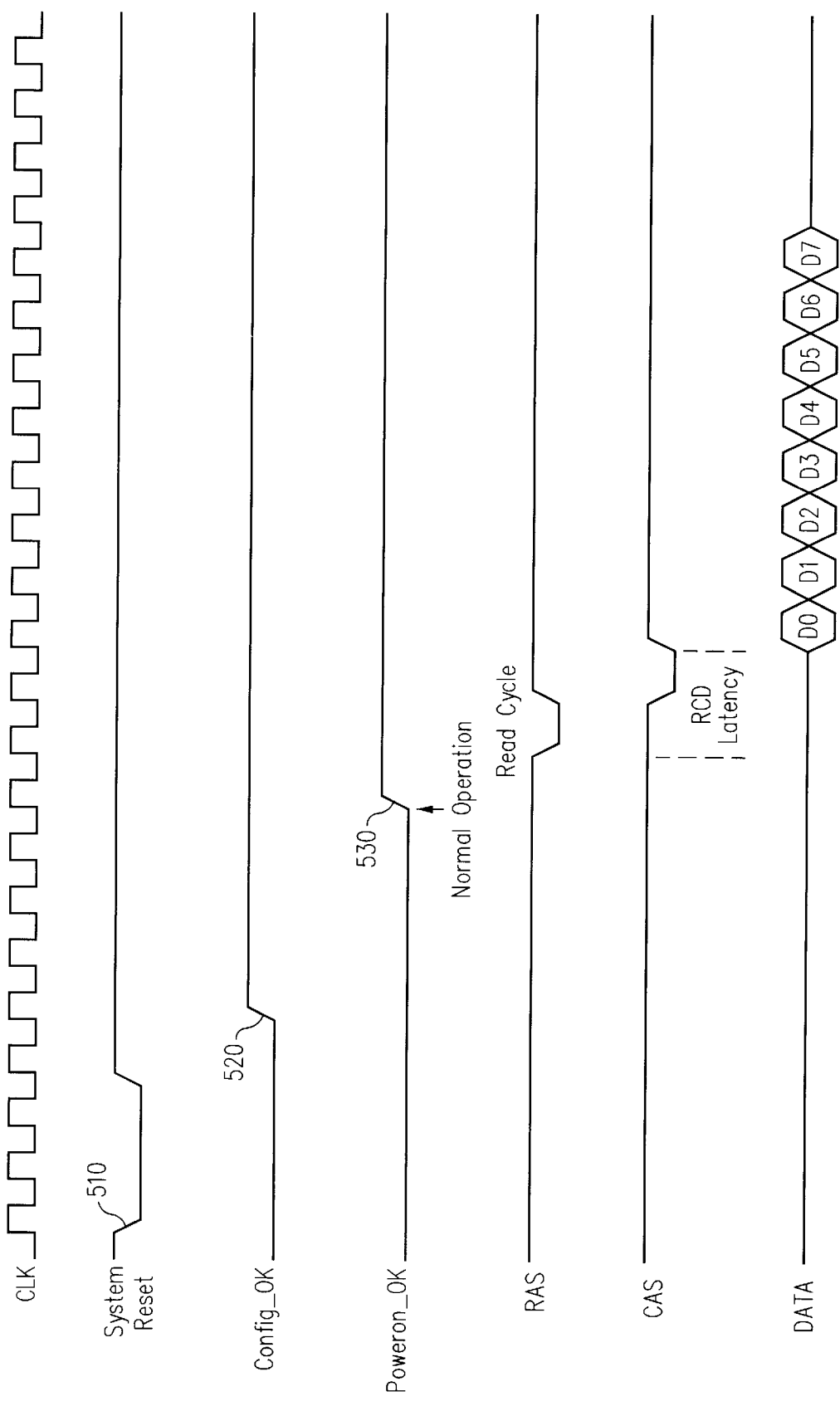
FIG. 5 shows a timing diagram for signals during power on and SDRAM initialization in accordance with an embodiment of this invention.

FIG. 5 shows a timing diagram for normal SDRAM function in accordance with one embodiment of this invention. A system reset is executed at power on at time 570 and an active low signal, System Reset, is generated, for example, by an external device on the circuit board to initiate configuration of registers 118, 120, 122, 124, 126, 128, 130, and 132. After an active low signal, System Reset, transitions to zero, and registers 118, 120, 122, 124, 126, 128, 130, and 132 are set to the values received via system bus 110. If registers 122, 124, 130, and 132 are set to an allowed value, an active high signal Config_OK is asserted indicating that the registers in Memory Controller Unit 100 have been set. Signal Config_OK remains asserted until a subsequent system reset or power down occurs. The active high signal Config_OK initiates SDRAM Power On Sequence State Machine 136 which causes initialization of SDRAMs 142 to be performed. At time 530, when the initialization of SDRAMs 142 is complete, an active high PowerOn_OK signal is generated by SDRAM Power On Sequence State Machine 136 allowing normal operation of SDRAMs 142.

The various embodiments of the structure and method of this invention that are described above are illustrative only of the principles of this invention and are not intended to limit the scope of the invention to the particular embodiments described. Many additional and alternative embodiments will be apparent to those skilled in the art, all of which are in the broad scope of this invention.

We claim:

1. A method for initializing a memory, the method comprising:

setting a plurality of registers, each one of said plurality of registers having an associated indicator signal capable of being in a first state or a second state, each said associated indicator signal being initially in said first state;

determining if one of a plurality of allowed coded values has been entered into each said one of said plurality of registers;

changing each said associated indicator signal to said second state for each said one of said plurality of registers having one of said plurality of allowed coded values;

asserting a first signal only if all said associated indicator signals are in said second state;

initializing said memory if said first signal is asserted; and asserting a second signal to enable operational access of said memory.

2. The method of claim 1 wherein said first signal is asserted to enable a Power On Sequence State Machine.

3. The method of claim 2, wherein said memory is initialized only if said Power On Sequence State Machine receives said first signal.

4. The method of claim 1 wherein said plurality of registers are used to store configuration parameters for initialization and operation of said memory.

5. The method of claim 1 wherein said memory is an SDRAM.

6. A structure for initializing a memory which comprises:
   a first register;
   a first comparison circuit coupled to said first register wherein said first comparison circuit causes a first indicator signal associated with said first register to be in a state that indicates whether a first coded value entered into said first register matches an allowed value for said first register;
   a second register;
   a second comparison circuit coupled to said second register wherein said second comparison circuit causes a second indicator signal associated with said second register to be in a state that indicates whether a second coded value entered into said second register matches an allowed value for said second register;
   a logic element coupled to said first and said second comparison circuits, said logic element generating an output signal indicating whether an allowed coded value was entered into all of said associated registers; and
   a memory initialization circuit coupled to an output terminal of said logic element and said memory;
   wherein if said output signal from said logic element indicates that an allowed coded value was entered into all of said associated registers, said output signal enables said memory initialization circuit to initialize said memory.

7. The structure of claim 6 wherein said logical element is an AND gate.

8. The structure of claim 6 wherein said initialization circuit sends a second signal to a Memory Controller Unit State Machine after said memory initialization, said second signal indicating said memory is initialized.

9. The structure of claim 6 wherein said memory is an SDRAM.

10. The structure of claim 6, wherein said first coded value indicates a refresh value of said memory.

11. The structure of claim 6, wherein said memory initialization circuit comprises a power on sequence state machine.

12. A structure for initializing a memory comprising:
   a plurality of registers;
   a plurality of comparison circuits, each one of said plurality of comparison circuits being coupled to one of said plurality of registers wherein said each one of said plurality of comparison circuits causes one of a plurality of indicator signals to be in a state that indicates whether a coded value entered into said one of said plurality of registers matches an allowed coded value for said one of said plurality of registers;
   a logic element coupled to said each one of said comparison circuits, said logic element generating a signal indicating whether all of said plurality of indicator signals are in said state that indicates that said allowed coded value was entered into said each one of said plurality of registers; and
   a memory initialization circuit coupled to an output terminal of said logic element and said memory;
   wherein if said output signal from said logic element indicates that said all of said plurality of indicator signals are in said state that indicates that said allowed coded values were entered into each one of said plurality of registers, said output signal enables said initialization circuit to initialize said memory.

13. The structure of claim 12, wherein said plurality of registers store configuration parameters for initialization and operation of said memory.

14. The structure of claim 13, wherein said memory initialization circuit comprises a power on sequence state machine.

15. The structure of claim 14, wherein said memory comprises an SDRAM.

16. A structure for initializing a memory that comprises an SDRAM, the structure comprising:
   a plurality of registers that store configuration parameters for initialization and operation of said memory, wherein the plurality of registers comprise a NOP TIME register, a RESET register, a CAS LATENCY register, a RAS PRECHARGE register, a BURST TYPE register, and a BURST LENGTH register;
   a plurality of comparison circuits, each one of said plurality of comparison circuits being coupled to one of said plurality of registers wherein said each one of said plurality of comparison circuits causes one of a plurality of indicator signals to be in a state that indicates whether a coded value entered into said one of said plurality of registers matches an allowed coded value for said one of said plurality of registers;
   a logic element coupled to said each one of said comparison circuits, said logic element generating a signal indicating whether all of said plurality of indicator signals are in said state that indicates that said allowed coded value was entered into said each one of said plurality of registers; and
   a memory initialization circuit coupled to an output terminal of said logic element and said memory, said memory initialization circuit comprising a power on sequence state machine;
   wherein if said output signal from said logic element indicates that said all of said plurality of indicator signals are in said state that indicates that said allowed coded values were entered into each one of said plurality of registers, said output signal enables said initialization circuit to initialize said memory.

17. A structure for initializing a memory, comprising:
   a first register;
   a first comparison circuit coupled to said first register wherein said first comparison circuit causes a first indicator signal associated with said first register to be in a state that indicates whether a first coded value entered into said first register matches an allowed value for said first register, wherein said first coded value indicates a column address strobe latency of said memory;
   a second register;
   a second comparison circuit coupled to said second register wherein said second comparison circuit causes a second indicator signal associated with said second resister to be in a state that indicates whether a second coded value entered into said second register matches an allowed value for said second register;
   a logic element coupled to said first and said second comparison circuits, said logic element generating an output signal indicating whether an allowed coded value was entered into all of said associated registers; and
   a memory initialization circuit coupled to an output terminal of said logic element and said memory, wherein if said output signal from said logic element indicates that an allowed coded value was entered into all of said associated registers, said output signal enables said memory initialization circuit to initialize said memory.

18. A structure for initializing a memory, comprising:

a first register;

a first comparison circuit coupled to said first register wherein said first comparison circuit causes a first indicator signal associated with said first register to be in a state that indicates whether a first coded value entered into said first register matches an allowed value for said first register, wherein said first coded value indicates a row address precharge value of said memory;

a second register;

a second comparison circuit coupled to said second register wherein said second comparison circuit causes a second indicator signal associated with said second register to be in a state that indicates whether a second coded value entered into said second register matches an allowed value for said second register;

a logic element coupled to said first and said second comparison circuits, said logic element generating an output signal indicating whether an allowed coded value was entered into all of said associated registers; and a memory initialization circuit coupled to an output terminal of said logic element and said memory, wherein if said output signal from said logic element indicates that an allowed coded value was entered into all of said associated registers, said output signal enables said memory initialization circuit to initialize said memory.

19. A structure for initializing a memory, comprising:

a first register;

a first comparison circuit coupled to said first register wherein said first comparison circuit causes a first indicator signal associated with said first register to be in a state that indicates whether a first coded value entered into said first register matches an allowed value for said first register, wherein said first coded value indicates a number of system clock cycles contained in a time period corresponding to a NOP operation;

a second register;

a second comparison circuit coupled to said second register wherein said second comparison circuit causes a second indicator signal associated with said second register to be in a state that indicates whether a second coded value entered into said second register matches an allowed value for said second register;

a logic element coupled to said first and said second comparison circuits, said logic element generating an output signal indicating whether an allowed coded value was entered into all of said associated registers; and a memory initialization circuit coupled to an output terminal of said logic element and said memory, wherein if said output signal from said logic element indicates that an allowed coded value was entered into all of said associated registers, said output signal enables said memory initialization circuit to initialize said memory.

20. A structure for initializing a memory, comprising:

a first register;

a first comparison circuit coupled to said first register wherein said first comparison circuit causes a first indicator signal associated with said first register to be in a state that indicates whether a first coded value entered into said first register matches an allowed value for said first register, wherein said first coded value indicates a burst length of said memory;

a second register;

a second comparison circuit coupled to said second register wherein said second comparison circuit causes a second indicator signal associated with said second register to be in a state that indicates whether a second coded value entered into said second register matches an allowed value for said second register;

a logic element coupled to said first and said second comparison circuits, said logic element generating an output signal indicating whether an allowed coded value was entered into all of said associated registers; and a memory initialization circuit coupled to an output terminal of said logic element and said memory, wherein if said output signal from said logic element indicates that an allowed coded value was entered into all of said associated registers, said output signal enables said memory initialization circuit to initialize said memory.

* * * * *